US010522605B2

(12) United States Patent
Cho et al.

(10) Patent No.: US 10,522,605 B2
(45) Date of Patent: Dec. 31, 2019

(54) THIN-FILM TRANSISTOR ARRAY SUBSTRATE AND ORGANIC LIGHT-EMITTING DISPLAY APPARATUS INCLUDING THE SAME

(71) Applicant: Samsung Display Co., Ltd., Yongin, Gyeonggi-do (KR)

(72) Inventors: Seunghwan Cho, Yongin (KR); Dohyun Kwon, Yongin (KR); Donghwan Shim, Yongin (KR); Sungeun Lee, Yongin (KR); Iljeong Lee, Yongin (KR); Jungkyu Lee, Yongin (KR); Jeongsoo Lee, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/714,557

(22) Filed: May 18, 2015

(65) Prior Publication Data
US 2016/0190221 A1 Jun. 30, 2016

(30) Foreign Application Priority Data

Dec. 29, 2014 (KR) .................. 10-2014-0192549

(51) Int. Cl.
*H01L 27/32* (2006.01)
*H01L 27/12* (2006.01)

(52) U.S. Cl.
CPC ...... *H01L 27/3265* (2013.01); *H01L 27/1255* (2013.01); *H01L 27/3262* (2013.01)

(58) Field of Classification Search
CPC .................................... H01L 27/3265
See application file for complete search history.

(56) References Cited

U.S. PATENT DOCUMENTS 7,164,153 B2   1/2007 Lee et al.
8,253,252 B2   8/2012 Shingu et al.
(Continued)

FOREIGN PATENT DOCUMENTS

JP   2008-270773   11/2008
KR   2005-0098123   10/2005
(Continued)

OTHER PUBLICATIONS

Kwok et al., *On the Calculation of Specific Contact Resistivity on <100> Si*, IEEE Transactions on Electron Devices, pp. 1535-1537, vol. 37, No. 6, Jun. 1990.
(Continued)

*Primary Examiner* — Jay C Chang
*Assistant Examiner* — Mikka Liu
(74) *Attorney, Agent, or Firm* — F. Chau & Associates, LLC

(57) ABSTRACT

A thin-film transistor (TFT) array substrate includes: a driving TFT provided on a substrate; and a switching TFT provided on the substrate and including: a switching semiconductor layer including a switching channel region, a switching source region, and a switching drain region; and a switching source electrode and a switching drain electrode contacting the switching semiconductor layer. The switching source electrode includes a source contact portion contacting the switching source region, and the switching drain electrode includes a drain contact portion contacting the switching drain region. The source contact portion is doped with ions that are different from ions of the switching source region and the drain contact portion is doped with ions that are different from ions of the switching drain region.

15 Claims, 6 Drawing Sheets

(56) References Cited

U.S. PATENT DOCUMENTS

| | | | |
|---|---|---|---|
| 2007/0096636 A1 | 5/2007 | Park et al. | |
| 2008/0142804 A1 | 6/2008 | Oh et al. | |
| 2009/0057674 A1 | 3/2009 | Jeong et al. | |
| 2014/0042539 A1 | 2/2014 | Hwang et al. | |
| 2014/0131677 A1 | 5/2014 | Oh et al. | |
| 2014/0145167 A1 | 5/2014 | Son | |
| 2014/0361276 A1* | 12/2014 | Hsu | H01L 51/56 257/40 |
| 2015/0243722 A1* | 8/2015 | Kwon | H01L 27/3262 257/40 |

FOREIGN PATENT DOCUMENTS

| | | |
|---|---|---|
| KR | 2007-0045690 | 5/2007 |
| KR | 2009-0021741 | 3/2009 |
| KR | 2014-0021096 | 2/2014 |
| KR | 2014-0061141 | 5/2014 |
| TW | 201428960 | 7/2014 |
| TW | 201448178 | 12/2014 |

OTHER PUBLICATIONS

Office Action issued by the Taiwanese Patent Office dated Jul. 9, 2019 in corresponding Taiwanese Patent Application No. 104141685 (8 pages).

* cited by examiner

THIN-FILM TRANSISTOR ARRAY SUBSTRATE AND ORGANIC LIGHT-EMITTING DISPLAY APPARATUS INCLUDING THE SAME

RELATED APPLICATION

This application claims the benefit of Korean Patent Application No. 10-2014-0192549, filed on Dec. 29, 2014, in the Korean Intellectual Property Office, the disclosure of which is incorporated herein in its entirety by reference.

BACKGROUND

Field

One or more embodiments relate to a thin-film transistor (TFT) array substrate and an organic light-emitting display apparatus including the same.

Description of the Related Technology

Organic light-emitting display apparatuses are self-emissive display apparatuses that include a hole injection electrode, an electron injection electrode, and an organic light-emitting diode (OLED) including an organic emission layer formed between the hole injection electrode and the electron injection electrode, and generate light as excitons that are generated when holes injected from the hole injection electrode and electrons injected from the electron injection electrode combine with each other in the organic emission layer and change from an excited state to a ground state.

Organic light-emitting display apparatuses that are self-emissive display apparatuses may operate at a low voltage and may be configured to be lightweight and thin because they do not need a light source, and have attracted attention as next-generation display apparatuses because of their wide viewing angles, high contrast ratio, and fast response times.

SUMMARY OF CERTAIN INVENTIVE ASPECTS

One or more embodiments include a thin-film transistor (TFT) array substrate and an organic light-emitting display apparatus including the same.

Additional aspects will be set forth in part in the description which follows and, in part, will be apparent from the description, or may be learned by practice of the presented embodiments.

According to one or more embodiments, a thin-film transistor (TFT) array substrate includes: a driving TFT provided on a substrate; and a switching TFT provided on the substrate and including: a switching semiconductor layer including a switching channel region, a switching source region, and a switching drain region; and a switching source electrode and a switching drain electrode contacting the switching semiconductor layer, wherein the switching source electrode includes a source contact portion contacting the switching source region, and wherein the switching drain electrode includes a drain contact portion contacting the switching drain region, and wherein the source contact portion is doped with ions that are different from ions of the switching source region and the drain contact portion is doped with ions that are different from ions of the switching drain region.

The switching source region and the switching drain region may be p-type doped, and the source contact portion and the drain contact portion may be n-type doped.

The switching source region and the switching drain region may be n-type doped, and the source contact portion and the drain contact portion may be p-type doped.

In the source contact portion and the switching source region, a barrier height may be increased due to a p-n junction.

In the drain contact portion and the switching drain region, a barrier height may be increased due to a p-n junction.

The TFT array substrate may further include a storage capacitor including: a first electrode connected to a driving gate electrode of the driving TFT; and a second electrode provided on the first electrode and insulated from the first electrode.

The TFT array substrate may further include an interlayer insulating film covering the storage capacitor and including an opening, wherein the second electrode is disposed in the opening.

According to one or more embodiments, an organic light-emitting display apparatus includes: a display area including a plurality of pixels; and a non-display area disposed around the display area, wherein each of the plurality of pixels includes: a driving thin-film transistor (TFT) provided on a substrate; and a switching TFT provided on the substrate and including: a switching semiconductor layer including a switching channel region, a switching source region, and a switching drain region; and a switching source electrode and a switching drain electrode contacting the switching semiconductor layer, wherein the switching source electrode includes a source contact portion contacting the switching source region, and wherein the switching drain electrode includes a drain contact portion contacting the switching drain region, and wherein the source contact portion is doped with ions that are different from ions of the switching source region and the drain contact portion is doped with ions that are different from ions of the switching drain region.

The switching source region and the switching drain region may be p-type doped and the source contact portion and the drain contact portion may be n-type doped.

The switching source region and the switching drain region may be n-type doped and the source contact portion and the drain contact portion may be p-type doped.

The organic light-emitting display apparatus may further include a storage capacitor including: a first electrode connected to a driving gate electrode of the driving TFT; and a second electrode provided on the first electrode and insulated from the first electrode.

The driving TFT and the storage capacitor may be arranged so that at least parts of the driving TFT and the storage capacitor overlap each other.

BRIEF DESCRIPTION OF THE DRAWINGS

These and/or other aspects will become apparent and more readily appreciated from the following description, taken in conjunction with the accompanying drawings in which.

DETAILED DESCRIPTION OF CERTAIN INVENTIVE EMBODIMENTS

Figure 1:
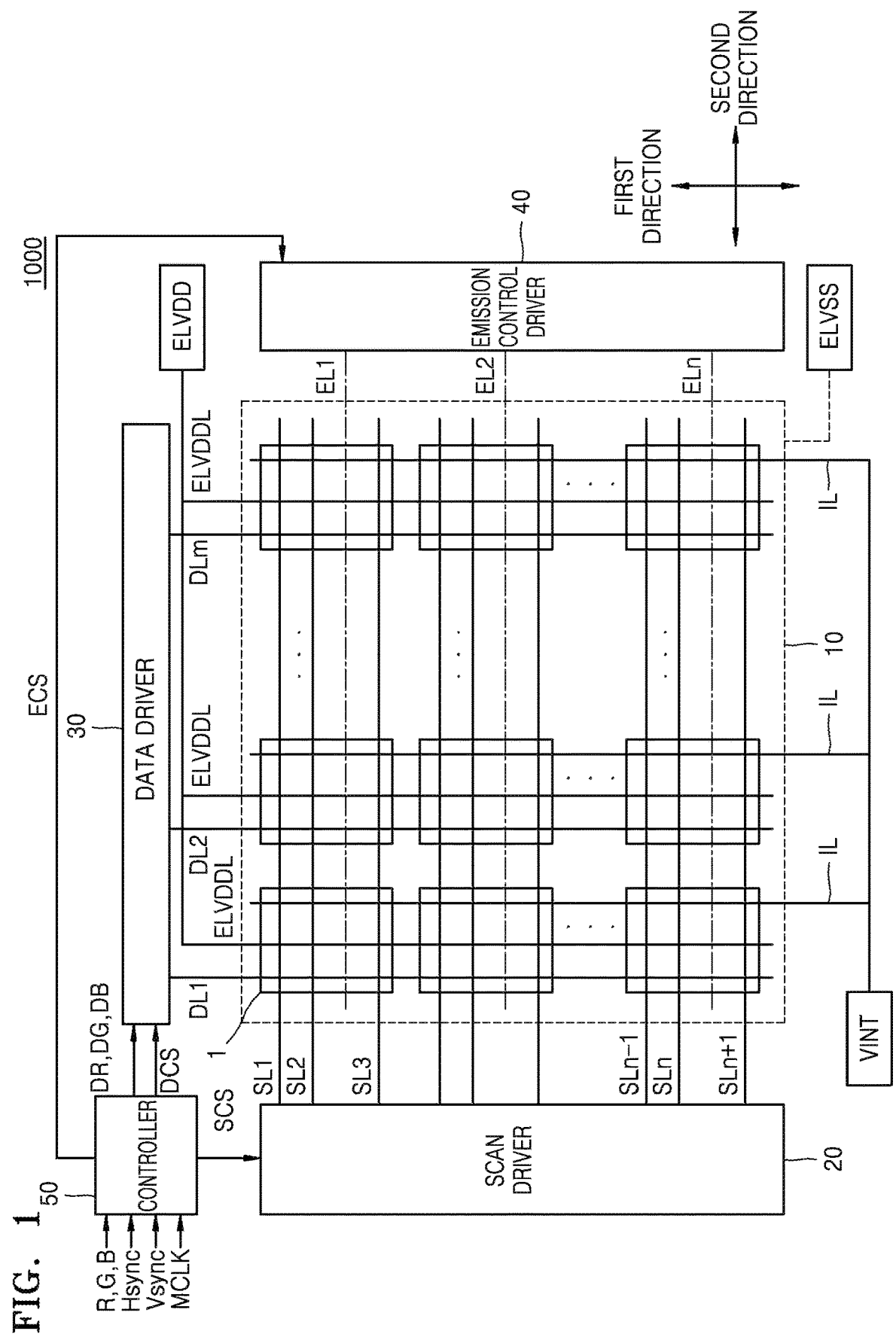
FIG. 1 is a diagram illustrating an organic light-emitting display apparatus according to an embodiment.

The inventive concepts will now be described more fully with reference to the accompanying drawings, in which certain embodiments are shown. It should be understood, however, that there is no intent to limit embodiments to the particular forms disclosed, but conversely, embodiments are to cover all modifications, equivalents, and alternatives falling within the spirit and scope of the disclosure. Like reference numerals generally denote like elements in the drawings.

It will be understood that, although the terms 'first', 'second', and the like may be used herein to describe various elements, these elements should not be limited by these terms. These terms are only used to distinguish one element from another.

The terminology used herein is for the purpose of describing embodiments only and is not intended to be limiting. It will be understood that the terms "comprises", "comprising", "includes" and/or "including", when used herein, specify the presence of stated features, integers, steps, operations, elements, components, and/or combinations thereof but do not preclude the presence or addition of one or more other features, integers, steps, operations, elements, components, and/or combinations thereof.

As used herein, the term "and/or" includes any and all combinations of one or more of the associated listed items. Expressions such as "at least one of," when preceding a list of elements, modify the entire list of elements and do not modify the individual elements of the list.

The disclosure will now be described more fully with reference to the accompanying drawings, in which certain embodiments are shown.

FIG. 1 is a diagram illustrating an organic light-emitting display apparatus 1000 according to an embodiment.

The organic light-emitting display apparatus 1000 includes a display unit 10 including a plurality of pixels 1, a scan driver 20, a data driver 30, an emission control driver 40, and a controller 50.

The display unit 10 includes the plurality of pixels 1 that are arranged in a matrix form at intersections of a plurality of scan lines SL1 through SLn+1, a plurality of data lines DL1 through DLm, and a plurality of emission control lines EL1 through ELn. The plurality of scan lines SL1 through SLn+1 and the plurality of emission control lines EL1 through ELn extend in a second direction that is a row direction, and the plurality of data lines DL1 through DLm and driving voltage lines ELVDDL extend in a first direction that is a column direction. n values of the plurality of scan lines SL1 through SLn+1 in one pixel line may be different from n values of the plurality of emission control lines EL1 through ELn.

Each of the pixels 1 is connected to three scan lines among the plurality of scan lines SL1 through SLn+1 that are connected to the display unit 10. The scan driver 20 generates and transmits three scan signals to each of the pixels 1 through the plurality of scan lines SL1 through SLn+1. That is, the scan driver 20 sequentially applies scan signals to a first scan line SL2~SLn, a second scan line SL1~SLn−1, and a third scan line SL3~SLn+1.

An external power supply source VINT may apply a display unit initialization voltage to an initialization voltage line IL.

Also, each of the pixels 1 is connected to one data line among the plurality of data lines DL1 through DLm that are connected to the display unit 10 and to one emission control line among the plurality of emission control lines EL1 through ELn that are connected to the display unit 10.

The data driver 30 transmits a data signal to each of the pixels 1 through the plurality of data lines DL1 through DLm. The data signal is applied to the pixel 1 that is selected by a scan signal whenever the scan signal is applied to the first scan line SL2~SLn.

The emission control driver 40 generates and transmits an emission control signal to each of the pixels 1 through the plurality of emission control lines EL1 through ELn. The emission control signal is used to control an emission time of each of the pixels 1. The emission control driver 40 may be omitted according to an internal structure of each of the pixels 1.

The controller 50 converts a plurality of image signals R, G, and B transmitted from the outside into a plurality of image data signals DR, DG, and DB and transmits the image data signals DR, DG, and DB to the data driver 30. Also, the controller 50 receives a vertical synchronization signal Vsync, a horizontal synchronization signal Hsync, and a clock signal MCLK, and generates and transmits control signals to the scan driver 20, the data driver 30, and the emission control driver 40 respectively, to control them. The controller 50 respectively generates and transmits a scan driving control signal SCS for controlling the scan driver 20, a data driving control signal DCS for controlling the data driver 30, and an emission driving control signal ECS for controlling the emission control driver 40.

A first power supply voltage ELVDD and a second power supply voltage ELVSS may be applied from the outside to each of the plurality of pixels 1. The first power supply voltage ELVDD may be a high-level voltage, and the second power supply voltage ELVSS may be a voltage having a lower level than that of the first power supply voltage ELVDD, or may be a ground voltage. The first power supply voltage ELVDD is applied to each of the pixels 1 through the driving voltage lines ELVDDL.

Each of the pixels 1 emits light of a predetermined brightness due to driving current supplied to a light-emitting device according to a data signal transmitted through the plurality of data lines DL1 through DLm.

Figure 2:
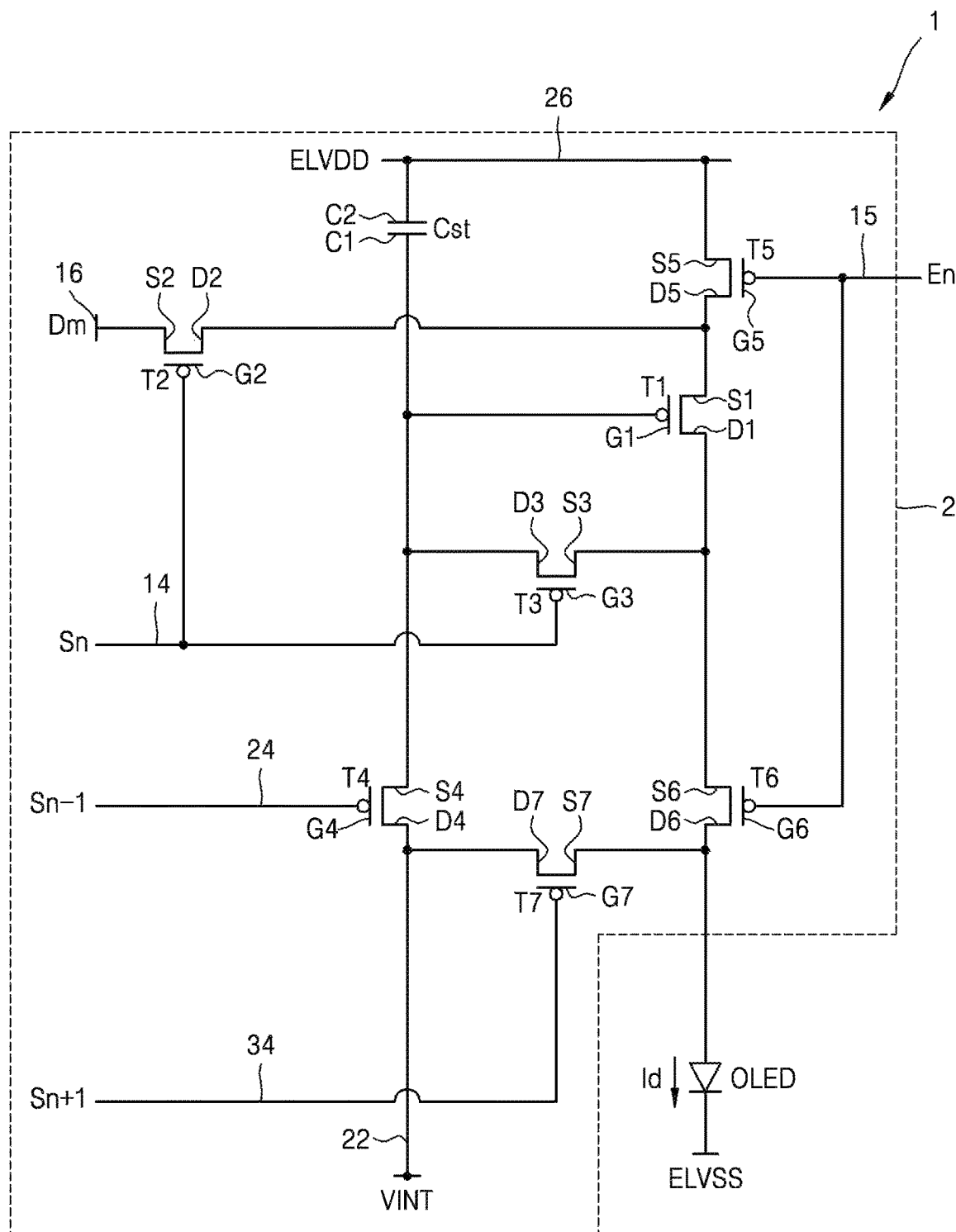
FIG. 2 is an equivalent circuit diagram illustrating one pixel of the organic light-emitting display apparatus, according to an embodiment.

FIG. 2 is an equivalent circuit diagram illustrating one pixel 1 of the organic light-emitting display apparatus 1000, according to an embodiment.

The pixel 1 of the organic light-emitting display apparatus 1000 includes a pixel circuit 2 including a plurality of TFTs and at least one storage capacitor Cst. The pixel 1 may include an organic light-emitting diode (OLED) that receives driving current from the pixel circuit 2 and emits light.

The plurality of TFTs include a driving TFT T1, a data transmission TFT T2, a compensation TFT T3, a first initialization TFT T4, a first emission control TFT T5, a second emission control TFT T6, and a second initialization TFT T7.

The pixel 1 includes a first scan line 14 that transmits a first scan signal Sn to the data transmission TFT T2 and the compensation TFT T3, a second scan line 24 that transmits a second scan signal Sn−1 to the first initialization TFT T4, a third scan line 34 that transmits a third scan signal Sn+1 to the second initialization TFT T7, an emission control line 15 that transmits an emission control signal En to the first emission control TFT T5 and the second emission control TFT T6, a data line 16 that transmits a data signal Dm, a driving voltage line 26 that transmits the first power supply voltage ELVDD, and an initialization voltage line 22 that transmits an initialization voltage VINT for initializing the driving TFT T1.

A driving gate electrode G1 of the driving TFT T1 is connected to a first electrode C1 of the storage capacitor Cst. A driving source electrode S1 of the driving TFT T1 is connected to the driving voltage line 26 through the first emission control TFT T5. A driving drain electrode D1 of the driving TFT T1 is electrically connected to a pixel electrode (such as, for example, an anode) of the OLED through the second emission control TFT T6. The driving TFT T1 receives the data signal Dm according to a switching operation of the data transmission TFT T2 and supplies driving current Id to the OLED.

A data transmission gate electrode G2 of the data transmission TFT T2 is connected to the first scan line 14. A data transmission source electrode S2 of the data transmission TFT T2 is connected to the data line 16. A data transmission drain electrode D2 of the data transmission TFT T2 is connected to the driving source electrode S1 of the driving TFT T1 and is connected to the driving voltage line 26 through the first emission control TFT T5. The data transmission TFT T2 is turned on according to the first scan signal Sn that is received through the first scan line 14, and performs a switching operation of transmitting the data signal Dm transmitted to the data line 16 to the driving source electrode S1 of the driving TFT T1.

A compensation gate electrode G3 of the compensation TFT T3 is connected to the first scan line 14. A compensation source electrode S3 of the compensation TFT T3 is connected to the driving drain electrode D1 of the driving TFT T1 and is connected to the anode of the OLED through the second emission control TFT T6. A compensation drain electrode D3 of the compensation TFT T3 is connected to the first electrode C1 of the storage capacitor Cst, a first initialization source electrode S4 of the first initialization TFT T4, and the driving gate electrode G1 of the driving TFT T1. The compensation TFT T3 is turned on according to the first scan signal Sn that is received through the first scan line 14, and diode-connects the driving TFT T1 by connecting the driving gate electrode G1 and the driving drain electrode D1 of the driving TFT T1.

A first initialization gate electrode G4 of the first initialization TFT T4 is connected to the second scan line 24. A first initialization drain electrode D4 of the first initialization TFT T4 is connected to the initialization voltage line 22. The first initialization source electrode S4 of the first initialization TFT T4 is connected to the first electrode C1 of the storage capacitor Cst, the compensation drain electrode D3 of the compensation TFT T3, and the driving gate electrode G1 of the driving TFT T1. The first initialization TFT T4 is turned on according to the second scan signal Sn−1 that is received through the second scan line 24, and performs an initialization operation of initializing a voltage of the driving gate electrode G1 of the driving TFT T1 by transmitting the initialization voltage VINT to the driving gate electrode G1 of the driving TFT T1.

A first emission control gate electrode G5 of the first emission control TFT T5 is connected to the emission control line 15. A first emission source electrode S5 of the first emission control TFT T5 is connected to the driving voltage line 26. A first emission drain electrode D5 of the first emission control TFT T5 is connected to the driving source electrode S1 of the driving TFT T1 and the data transmission drain electrode D2 of the data transmission TFT T2.

A second emission control gate electrode G6 of the second emission control TFT T6 is connected to the emission control line 15. A second emission source electrode S6 of the second emission control TFT T6 is connected to the driving drain electrode D1 of the driving TFT T1 and the compensation source electrode S3 of the compensation TFT T3. A second emission control drain electrode D6 of the second emission control TFT T6 is electrically connected to the anode of the OLED. The first emission control TFT T5 and the second emission control TFT T6 are simultaneously turned on according to the emission control signal En that is received through the emission control line 15, the first power supply voltage ELVDD is transmitted to the OLED, and the driving current Id flows in the OLED.

A second initialization gate electrode G7 of the second initialization TFT T7 is connected to the third scan line 34. A second initialization source electrode S7 of the second initialization TFT T7 is connected to the anode of the OLED. A second initialization drain electrode D7 of the second initialization TFT T7 is connected to the initialization voltage line 22. The second initialization TFT T7 is turned on according to the third scan signal Sn+1 that is received through the third scan line 34 and initializes the anode of the OLED.

A second electrode C2 of the storage capacitor Cst is connected to the driving voltage line 26. The first electrode C1 of the storage capacitor Cst is connected to the driving gate electrode G1 of the driving TFT T1, the compensation drain electrode D3 of the compensation TFT T3, and the first initialization source electrode S4 of the first initialization TFT T4.

A cathode of the OLED is connected to the second power supply voltage ELVSS. The OLED displays an image by receiving the driving current from the driving TFT T1 and emitting light.

Figure 3:
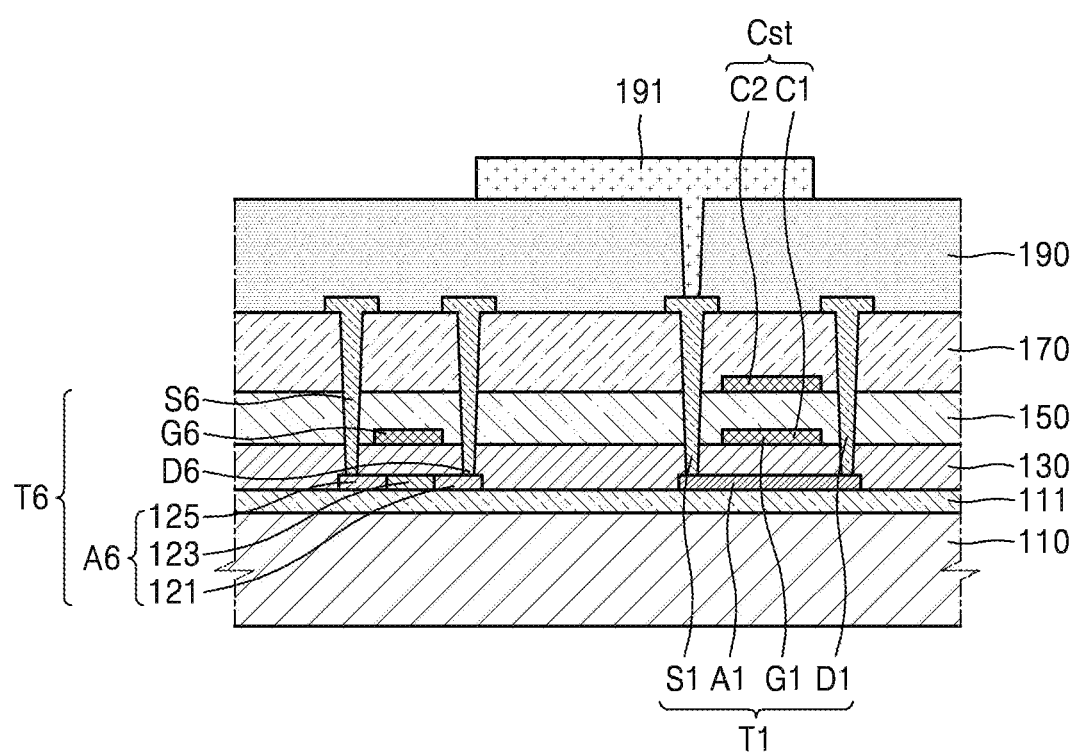
FIG. 3 is a cross-sectional view illustrating a thin-film transistor (TFT) array substrate according to an embodiment.
Figure 4:
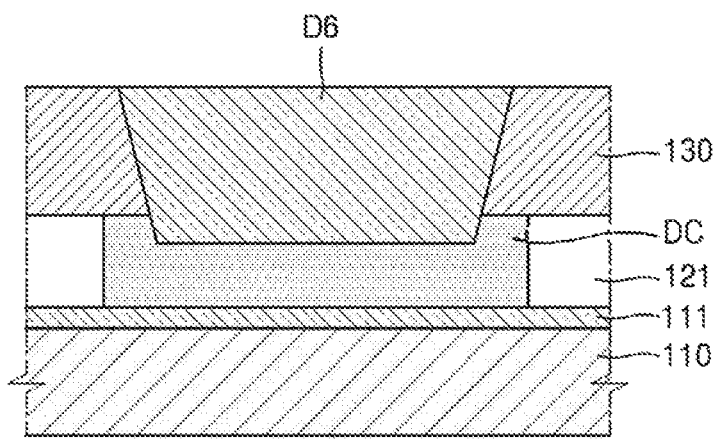
FIG. 4 is an enlarged view illustrating a portion of a switching source electrode and a portion of a switching drain electrode that contacts a switching semiconductor layer of FIG. 3, according to an embodiment.
Figure 4:
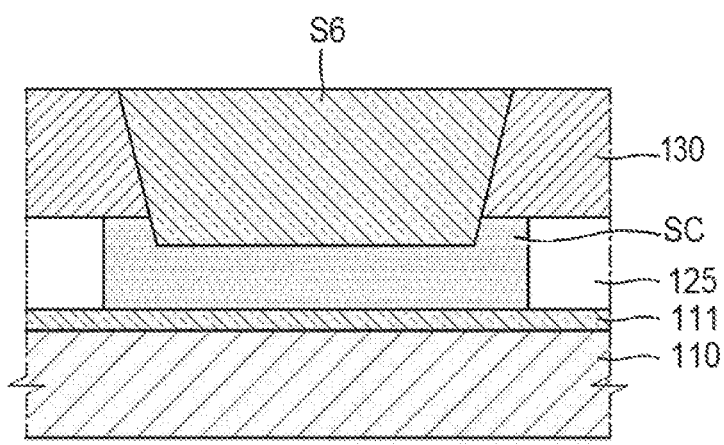

FIG. 3 is a cross-sectional view illustrating a TFT array substrate according to an embodiment. FIG. 4 is an enlarged view illustrating a portion of a switching source electrode and a portion of a switching drain electrode that contacts a switching semiconductor layer, according to an embodiment.

The term 'TFT array substrate' refers to a substrate including at least one TFT. The term 'TFT array substrate' used herein refers to a substrate in which a plurality of TFTs are regularly arranged, a plurality of TFTs are irregularly arranged, or only one TFT is disposed.

Although the TFT array substrate is applied to the organic light-emitting display apparatus 1000 in the some embodiments, the disclosure is not limited thereto. The TFT array substrate may be applied to any of various display apparatuses such as a liquid crystal display apparatus, an electrophoretic display apparatus, or a plasma display apparatus, or other display apparatuses.

For clarity, elements that are less relevant to the driving TFT T1, a switching TFT, and the storage capacitor Cst such as some wirings, some electrodes, and some semiconductor layers present in the cross-sectional view taken along a cut line are not shown in FIG. 3.

As shown in FIG. 3, the TFT array substrate may include the driving TFT T1, the storage capacitor Cst, the switching TFT, a first interlayer insulating film 150, and a second interlayer insulating film 170. The term 'switching TFT' used herein refers to a TFT that is other than the driving TFT T1 and mainly performs a switching operation. That is, the switching TFT may correspond to any of the data transmission TFT T2, the compensation TFT T3, the first initialization TFT T4, the first emission control TFT T5, the second emission control TFT T6, and the second initialization TFT T7. The second emission control TFT T6 corresponds to the switching TFT (hereinafter, referred to as the switching TFT T6) in FIG. 3.

The driving TFT T1 includes a driving semiconductor layer A1, the driving gate electrode G1, the driving source electrode S1, and the driving drain electrode D1. The driving gate electrode G1 may be integrally formed with the same layer as that of the first electrode C1 of the storage capacitor Cst.

The switching TFT T6 includes a switching semiconductor layer A6, a switching gate electrode (hereinafter, referred to as the switching gate electrode G6) corresponding to the second emission control gate electrode G6, a switching source electrode (hereinafter, referred to as the switching source electrode S6) corresponding to the second emission control source electrode S6, and a switching drain electrode (hereinafter, referred to as the switching drain electrode D6) corresponding to the second emission control drain electrode D6. The switching semiconductor layer A6 may include a switching drain region 121 and a switching source region 125 that are doped with impurities, and a switching channel region 123 that is formed between the switching drain region 121 and the switching source region 125. The switching semiconductor layer A6 will be explained below in further detail.

The first interlayer insulating film 150 and the second interlayer insulating film 170 are stacked on the switching TFT T6. There is a portion where only the first interlayer insulating film 150 is disposed between the first electrode C1 and the second electrode C2 of the storage capacitor Cst.

In order to ensure high performance and/or high integration of the TFT array substrate, various wirings and various TFTs may be arranged, and the wirings may overlap each other or the wirings and the TFTs may overlap each other. Accordingly, parasitic capacitance and/or signal interference may occur in the TFT array substrate.

The second interlayer insulating film 170 may be additionally disposed between the wirings and/or between the wirings and the TFTs in order to reduce parasitic capacitance and/or signal interference. Since there is a portion where the second interlayer insulating film 170 is not disposed between the first electrode C1 and the second electrode C2 of the storage capacitor Cst, a high storage capacity may be maintained.

The first interlayer insulating film 150 is provided to ensure a high storage capacity of the storage capacitor Cst. In order to increase a storage capacity, a thickness t1 of the first interlayer insulating film 150 may be small and/or a material having a high dielectric constant may be used to form the first interlayer insulating film 150.

The second interlayer insulating film 170 is provided to reduce parasitic capacitance. In order to reduce parasitic capacitance, a thickness t2 of the second interlayer insulating film 170 may be large and/or a material having a low dielectric constant may be used to form the second interlayer insulating film 170.

In some embodiments, the thickness t2 of the second interlayer insulating film 170 may be greater than the thickness t1 of the first interlayer insulating film 150. For example, the thickness t2 of the second interlayer insulating film 170 may be about two to five times greater than the thickness t1 of the first interlayer insulating film 150. The thickness t2 of the second interlayer insulating film 170 may range from about 1 μm to about 5 μm. The thickness t1 of the first interlayer insulating film 150 may range from about 0.2 μm to about 1 μm. However, embodiments are not limited thereto. For example, the thickness t2 of the second interlayer insulating film 170 may be less than or equal to the thickness t1 of the first interlayer insulating film 150 in some embodiments.

In some embodiments, a dielectric constant of the second interlayer insulating film 170 may be less than a dielectric constant of the first interlayer insulating film 150.

In some embodiments, the second interlayer insulating film 170 may include an organic material and the first interlayer insulating film 150 may include an inorganic material. A thickness of the second interlayer insulating film 170 when the second interlayer insulating film 170 includes an organic material may be more easily greater than when the second interlayer insulating film 170 includes an inorganic material. Accordingly, when the second interlayer insulating film 170 includes an organic material and the first interlayer insulating film 150 includes an inorganic material, a possibility that the thickness t2 of the second interlayer insulating film 170 is greater than the thickness t1 of the first interlayer insulating film 150 and a material of the second interlayer insulating film 170 has a low dielectric constant that may be increased.

Referring back to FIG. 3, a buffer layer 111 may be formed on a substrate 110. The buffer layer 111 may prevent impurity ions from being diffused and prevent moisture or external air from penetrating into the organic light emitting diode, and may function as a blocking layer and/or a barrier layer for planarizing a surface of the substrate 110

The driving semiconductor layer A1 and the switching semiconductor layer A6 are formed on the buffer layer 111. Each of the driving and switching semiconductor layers A1 and A6 may include polysilicon, and may include a channel region that is not doped with impurities, and a source region and a drain region that are formed on both sides of the channel region and doped with impurities. The impurities may vary depending on a type of a TFT and may be N-type impurities or P-type impurities. Although only the second emission control TFT T6 is shown in FIG. 3, the data transmission semiconductor layer A2 of the data transmission TFT T2, the compensation semiconductor layer A3 of the compensation TFT T3, the first initialization semiconductor layer A4 of the first initialization TFT T4, the second initialization semiconductor layer A7 of the second initialization TFT T7, and the first emission control semiconductor layer A5 of the first emission control TFT T5 may also be simultaneously formed to be connected to the driving semiconductor layer A1 and the second emission control semiconductor layer A6.

The switching semiconductor layer A6 may include the switching channel region 123 that is not doped with impurities, and the switching source region 125 and the switching drain region 121 that are formed on both sides of the switching channel region 123 and doped with impurities as described above.

Referring to FIG. 4, a portion of the switching drain electrode D6 that contacts the switching drain region 121 may be referred to as a drain contact portion DC. That is, only a central portion of the switching drain region 121 that locally contacts the switching drain electrode D6 corresponds to the drain contact portion DC. Portions of the switching drain region 121 that do not directly contact the switching drain electrode D6 are disposed on both sides of the drain contact portion DC.

A portion of the switching source electrode S6 that contacts the switching source region 125 is referred to as a source contact portion SC. That is, only a central portion of the switching source region 125 that locally contacts the switching source electrode S6 corresponds to the source contact portion SC.

In the TFT array substrate, impurity ions doped into the drain contact portion DC may be different from impurity ions doped into the switching drain region 121, as shown in FIG. 4.

Also, impurity ions doped into the source contact portion SC may be different from impurity ions doped into the switching source region 125.

When locally different impurity ions are doped into only the drain contact portion DC of the switching drain region 121 or the source contact portion SC of the switching source region 125, a p-n junction may be formed along a boundary.

The term 'p-n junction' refers to an interface between semiconductors having properties that are useful in modern electronics. Both a P-type semiconductor and an N-type semiconductor have high conductivities whereas an interface between the P-type semiconductor and the N-type semiconductor has low conductivity.

An interface between semiconductors having low conductivity is referred to as a depletion zone that is formed when holes that are carriers of the P-type semiconductor and electrons that are carriers of the N-type semiconductor attract each other, recombine with each other, and diffuse away.

A diode may be formed by using such a depletion zone having low conductivity. The term 'diode' refers to a device in which current may flow only in one direction and does not flow in the other direction.

In a region where a p-n junction is formed, a barrier height is increased in energy.

The switching drain region 121, the switching source region 125, the drain contact portion DC, and the source contact portion SC may be doped with N-type impurities or P-type impurities according to types of ions.

The goal of doping with N-type impurities is to increase electrons that act as carriers. Since the switching semiconductor layer A6 may include polysilicon as described above, silicon will be explained as an example. Each silicon atom has four electrons and forms four covalent bonds with four neighboring silicon atoms.

When an atom having five electrons such as phosphorus (P), arsenic (As), antimony (Sb), or bismuth (Bi) is added to a crystalline structure of the silicon atom, the added atom has four covalent bonds, and one electron that is not shared remains. The remaining electron is weakly bound to the added atom and thus is easily lifted to a conduction band. At room temperature, any such electron is actually lifted to the conduction band. When electrons are lifted in this manner, electron holes are not formed, and thus there are much more electrons than electron holes in a material that is N-type doped. In this case, the electrons become majority carriers and the electron holes become minority carriers.

In contrast, the goal of doping with P-type impurities is to increase electron holes. When a trivalent atom such as boron (B), aluminum (Al), indium (In), or gallium (Ga) is added to a crystal structure of a silicon atom, one bond from among four covalent bonds of the silicon atom is left incomplete due to one electron deficiency.

Accordingly, the trivalent atom that is a dopant may borrow an electron from a neighboring atom in order to complete a fourth bond. The dopant may be referred to as an acceptor. Once the dopant accepts one electron, the neighboring atom loses one electron, thereby creating an "electron hole." Each electron hole is associated with an adjacent negatively charged dopant ion, and thus, a semiconductor remains neutral. However, when each electron hole wanders away into a lattice, a proton at a position of the electron hole is "exposed" and thus is no longer cancelled by an electron. Accordingly, the electron hole behaves as a positive charge. If many acceptor atoms are added, the electron holes greatly outnumber thermally excited electrons. Accordingly, in a P-type material, electron holes become majority carriers and electrons become minority carriers.

In one embodiment, the switching drain region 121 and the switching source region 125 of the switching thin film transistor T6 may be doped with N-type impurities. In this case, the drain contact portion DC and the source contact portion SC are doped with P-type impurities.

Accordingly, a p-n junction may be formed in each of the switching drain region 121 and the switching source region 125.

Once the p-n junction is formed, a barrier height is increased and a contact resistance Rc is increased in energy as described above.

Once the contact resistance Rc is increased, an IR value is reduced and thus degradation due to a high voltage Vds is avoided.

Also, characteristics such as drain-induced barrier lowering (DIBL) and hot-carrier instability (HCI) are improved.

DIBL refers to a phenomenon where when the Vds voltage is increased at a short channel, current is increased by reducing a PN junction barrier of a drain region. When the contact resistance Rc between p+poly and source/drain electrode is increased and current flows, an IR drop occurs, thereby applying between the source and the drain a voltage that is lower than that the Vds voltage that is actually applied.

Accordingly, when the contact resistance Rc is high, DIBL is improved at a short channel.

Likewise, HCI is a phenomenon where when a high Vds voltage is applied to a short channel, a high drain field is formed, and thus, an electron-hole pair is formed in a drain region, thereby degrading a device.

Likewise, hot carriers are suppressed from being formed due to a drain field by causing an IR drop and reducing a voltage that is applied between a source and a drain to be lower than the Vds voltage that is actually applied. Accordingly, HCI may be reduced.

In another embodiment, the switching drain region 121 and the switching source region 125 of the switching TFT T6 may be doped with P-type impurities. In this case, the drain contact portion DC and the source contact portion SC are doped with N-type impurities.

Even in this case, like in the above example, a p-n junction may be formed in each of the switching drain region 121 and the switching source region 125.

Referring back to FIG. 3, a gate insulating film 130 is stacked on an entire surface of the substrate 110 to cover the semiconductor layers A1 to A7. The gate insulating film 130 may include an inorganic material such as, for example, silicon oxide or silicon nitride, to have a single-layer structure or a multi-layer structure. The gate insulating film 130 insulates each semiconductor layer from its corresponding gate electrode among the gate electrodes G1 to G7.

The switching gate electrode G6 of the switching TFT T6, the driving gate electrode G1 of the driving TFT T1, and the first electrode C1 of the storage capacitor Cst are formed on the gate insulating film 130. The driving gate electrode G1 may be integrally formed with the first electrode C1 of the storage capacitor Cst.

Also, although not shown in FIG. 3, the gate electrodes G1 to G7 of the plurality of TFTs T1 to T7, the first scan line 14, the second scan line 24, the third scan line 34, a mesh driving voltage line 26', and the initialization voltage line 22 may include the same material on the same layer as the driving gate electrode G1, the second emission control gate electrode G6, the first electrode C1, and the emission control line 15.

A material of the driving gate electrode G1, the switching gate electrode G6, the first electrode C1, and the emission control line 15 may include at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and copper (Cu).

According to one embodiment, the storage capacitor Cst may overlap the driving TFT T1. In detail, since the driving TFT T1 and the first electrode C1 are integrally formed with each other, the storage capacitor Cst and the driving TFT T1 overlap each other. Since the storage capacitor Cst overlaps the driving TFT T1, sufficient areas for the first electrode C1 and the second electrode C2 may be secured. Accordingly, a sufficient storage capacity of the storage capacitor Cst may be ensured.

The first interlayer insulating film 150 is formed on the entire surface of the substrate 110 to cover the driving gate electrode G1, the switching gate electrode G6, and the first electrode C1 of the storage capacitor Cst.

The first interlayer insulating film 150 may include an inorganic material or an organic material. In some embodiments, the first interlayer insulating film 150 may include an inorganic material. For example, the first interlayer insulating film 150 may include a metal oxide or a metal nitride. Examples of the inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZrO_2$). In some embodiments, the first interlayer insulating film 150 may include a material having a dielectric constant ranging from about 4 to about 7.

The first interlayer insulating film 150 may include an inorganic material such as, for example, silicon oxide ($SiO_x$) and/or silicon nitride ($SiN_x$) to have a single-layer structure or a multi-layer structure. In some embodiments, the first interlayer insulating film 150 may have a double layer structure such as, for example, $SiO_x/SiN_y$ or $SiN_x/SiO_y$.

The first interlayer insulating film 150 may insulate the driving gate electrode G1, the switching gate electrode G6, and the first electrode C1 from wirings that are formed on the first interlayer insulating film 150. Also, the first interlayer insulating film 150 may function as a dielectric layer of the storage capacitor Cst. The thickness t1 of the first interlayer insulating film 150 may be less than the thickness t2 of the second interlayer insulating film 170. The thickness t1 of the first interlayer insulating film 150 may be set by taking into account a storage capacity of the storage capacitor Cst.

The second interlayer insulating film 170 may include an inorganic material or an organic material. In some embodiments, the second interlayer insulating film 170 may include an organic material. For example, the second interlayer insulating film 170 may include at least one of acryl-based resin (such as for example, polyacrylate resin), epoxy resin, phenolic resin, polyamide resin, polyimide resin, unsaturated polyester resin, polyphenylene ether resin, and benzocyclobutene (BCB). In some embodiments, the second interlayer insulating film 170 may include a material having a dielectric constant ranging from about 2 to about 4.

A planarization film 190 is formed on the first interlayer insulating film 170 over the entire surface of the substrate 110. A pixel electrode 191 may be formed in the planarization film 190. The pixel electrode 191 is connected to the driving source electrode S1 through a via hole The planarization film 190 may include an insulating material. For example, the planarization film 190 may include an inorganic material, an organic material, or a combination thereof to have a single-layer structure or a multi-layer structure, and may be formed by using any of various deposition methods. In some embodiments, the planarization film 190 may include at least one of acryl-based resin (such as for example, polyacrylate resin), epoxy resin, phenolic resin, polyamide resin, polyimide rein, unsaturated polyester resin, polyphenylene ether resin, poly phenylenesulfide resin, and BCB.

Figure 5:
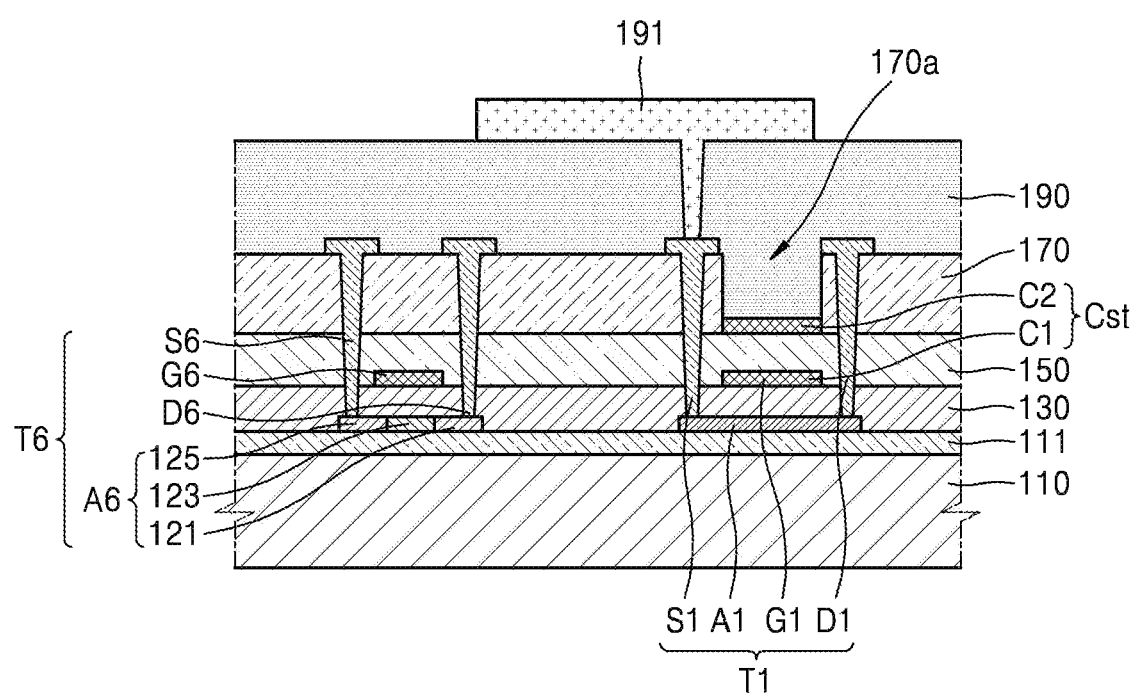
FIG. 5 is a cross-sectional view illustrating the TFT array substrate according to another embodiment.

FIG. 5 is a cross-sectional view illustrating a TFT array substrate according to another embodiment. The same elements as those in FIG. 3 are denoted by the same reference numerals, and a repeated explanation thereof will not be given for convenience of description.

The second interlayer insulating film 170 in FIG. 5 is disposed on the first interlayer insulating film 150, and includes an opening 170a through which a part of the first interlayer insulating film 150 is exposed. The second electrode C2 of the storage capacitor Cst is disposed in the opening 170a.

The second electrode C2 of the storage capacitor Cst is disposed in the opening 170a of the second interlayer insulating film 170. Since the second electrode C2 overlaps the first electrode C1, the opening 170a is formed in a portion that overlaps the first electrode C1 of the storage capacitor Cst. Since the second electrode C2 is disposed in the opening 170a, the second electrode C2 may contact a top surface of the first interlayer insulating film 150. Also, the second electrode C2 may extend along a side wall of the opening 170a up to a top surface of the second interlayer insulating film 170. However, embodiments are not limited thereto, and the second electrode C2 may be formed only in the opening 170a, as shown in FIG. 5.

Since the second electrode C2 of the storage capacitor Cst is disposed in the opening 170a of the second interlayer insulating film 170, a storage capacity of the storage capacitor Cst depends on a dielectric constant and the thickness t1 of the first interlayer insulating film 150. Accordingly, since a material and the thickness t1 of the first interlayer insulating film 150 are set regardless of the second interlayer insulating film 170, a high storage capacity of the storage capacitor Cst may be ensured.

Figure 6:
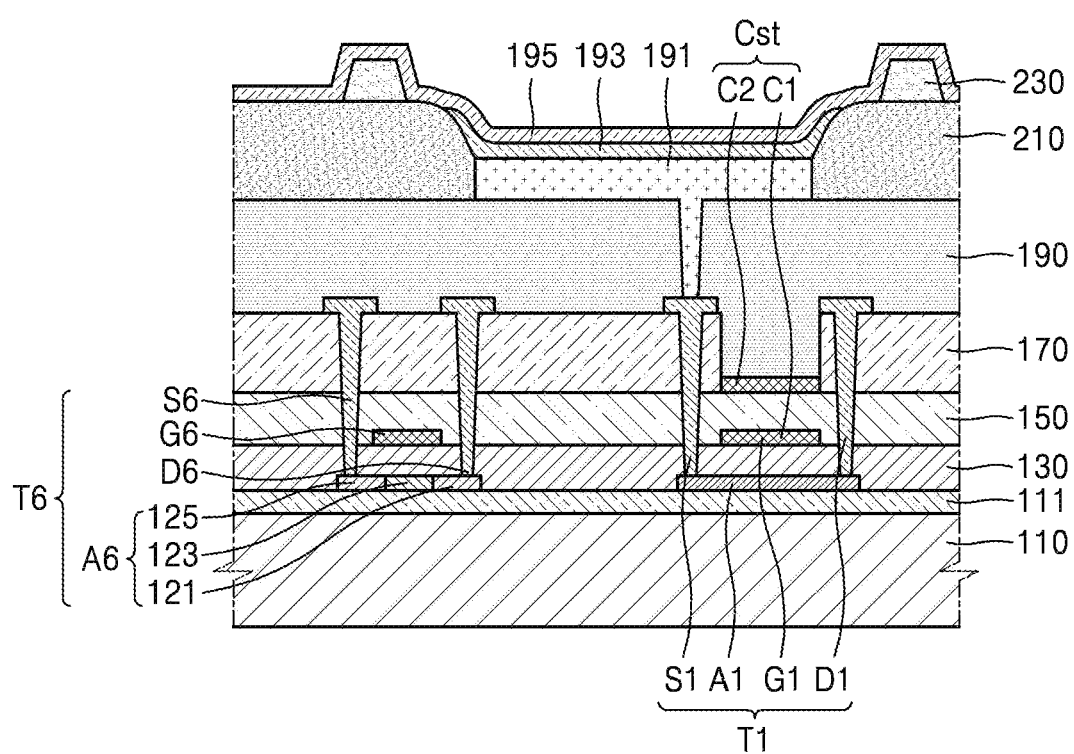
FIG. 6 is a cross-sectional view illustrating an organic light-emitting display apparatus according to another embodiment.

FIG. 6 is a cross-sectional view illustrating an organic light-emitting display apparatus according to another embodiment. FIG. 6 illustrates an organic light-emitting display apparatus including the TFT array substrate of FIG. 5. In FIG. 6, the same elements as those in FIG. 5 are denoted by the same reference numerals, and a repeated explanation thereof will not be given for convenience of description.

An OLED is provided on the TFT array substrate in a display area of the organic light-emitting display apparatus. The OLED includes the pixel electrode 191, an intermediate layer 193 including an organic emission layer, and a counter electrode 195. Also, the organic light-emitting display apparatus may further include a pixel-defining film 210 and a spacer 230.

The pixel electrode 191 and/or the counter electrode 195 may be a transparent electrode or a reflective electrode. When the pixel electrode 191 and/or the counter electrode 195 is a transparent electrode, the pixel electrode 191 and/or the counter electrode 195 may include ITO, IZO, ZnO, or $In_2O_3$. When the pixel electrode 191 and/or the counter electrode 195 is a reflective electrode, the pixel electrode 191 and/or the counter electrode 195 may include a reflective film including Ag, Mg, Al, Pt, Pd, Au, Ni, Nd, Ir, Cr, or a compound thereof and a transparent film including ITO, IZO, ZnO, or In2O3. In some embodiments, the pixel electrode 191 or the counter electrode 195 may have a structure such as, for example, ITO/Ag/ITO.

The pixel-defining film 210 may define a pixel region and a non-pixel region. The pixel-defining film 210 may include an opening through which the pixel electrode 191 is exposed and may be formed to completely cover the TFT array substrate. The intermediate layer 193 may be formed in the opening, and the opening may substantially become a pixel region.

The pixel electrode 191, the intermediate layer 193, and the counter electrode 195 may constitute the OLED. Holes and electrons respectively injected from the pixel electrode 191 and the counter electrode 195 of the OLED may combine with each other in the organic emission layer of the intermediate layer 193 to generate light.

The intermediate layer 193 may include the organic emission layer. Alternatively, the intermediate layer 193 may include the organic emission layer, and may further include at least one of a hole injection layer (HIL), a hole transport layer (HTL), an electron transport layer (ETL), and an electron injection layer (EIL). However, embodiments are not limited thereto, and the intermediate layer 193 may include the organic emission layer and may further include any of various other functional layers.

The counter electrode 195 is formed on the intermediate layer 193. The counter electrode 195 may form an electric field with the pixel electrode 191 to emit light from the intermediate layer 193. The pixel electrode 191 may be patterned in each pixel, and the counter electrode 195 may be formed so that a common voltage is applied to all pixels.

The spacer 230 may be disposed between pixel regions in a display area. The spacer 230 may be provided to maintain an interval between the substrate 110 and a sealing substrate (not shown) and to prevent display characteristics from being degraded due to external impact.

The spacer 230 may be provided on the pixel-defining film 210. The spacer 230 may protrude from the pixel-defining film 210 toward the sealing substrate.

As described above, in an organic light-emitting display apparatus according to the one or more embodiments, since a source contact portion and a drain contact portion of a switching source electrode and a switching drain electrode that contact a switching semiconductor layer are doped with impurities that are different from impurities of a switching source region and a switching drain region, a p-n junction may be formed. Accordingly, the resistance Rc is increased, and IR is reduced, and thus, degradation due to a high voltage is avoided.

In addition, since an opening, in which the second electrode C2 of a storage capacitor is disposed, is formed in the second interlayer insulating film 170, parasitic capacitance may be reduced and a high storage capacity of the storage capacitor may be ensured.

As described above, according to the one or more embodiments, a contact resistance is increased and IR is reduced, and thus degradation due to a high voltage is avoided.

While the disclosure has been particularly shown and described with reference to certain embodiments, it will be understood by those of ordinary skill in the art that various changes in form and detail may be made therein without departing from the spirit and scope of the disclosure as defined by the following claims. Therefore, the scope is defined not by the detailed description but by the appended claims, and all differences within the scope will be construed as being included in the disclosure.

What is claimed is:

1. A thin-film transistor (TFT) array substrate comprising:
   a gate insulating film provided on a substrate;
   a driving TFT provided on the substrate; and
   a switching TFT provided on the substrate and comprising:
      a switching semiconductor layer comprising a switching channel region, a switching source region, and a switching drain region; and
      a switching source electrode and a switching drain electrode contacting the switching semiconductor layer,
   wherein the switching source electrode comprises a source contact portion surrounded on at least two sides of the source contact portion by the switching source region in a plane parallel to the substrate and contacting the switching source region in a vertical direction with respect to the substrate,
   wherein the switching drain electrode comprises a drain contact portion surrounded on at least two sides of the drain contact portion by the switching drain region in the plane parallel to the substrate and contacting the switching drain region in the vertical direction with respect to the substrate,
   wherein the source contact portion comprises one selected from p-type impurities and n-type impurities, the switching source region comprising the other one of the p-type and n-type impurities not selected by the source contact portion,
   wherein the drain contact portion comprises one selected from p-type impurities and n-type impurities, the switching drain region comprising the other one of the p-type and n-type impurities not selected by the drain contact portion, and
   wherein the source contact portion, the drain contact portion, an upper surface of the switching source region and an upper surface of the switching drain region each directly contact the gate insulating film.

2. The TFT array substrate of claim 1, wherein the switching source region and the switching drain region are p-type doped, and the source contact portion and the drain contact portion are n-type doped.

3. The TFT array substrate of claim 1, wherein the switching source region and the switching drain region are n-type doped, and the source contact portion and the drain contact portion are p-type doped.

4. The TFT array substrate of claim 1, wherein in the source contact portion and the switching source region, a barrier height is increased due to a p-n junction.

5. The TFT array substrate of claim 1, wherein in the drain contact portion and the switching drain region, a barrier height is increased due to a p-n junction.

6. The TFT array substrate of claim 1, further comprising a storage capacitor comprising: a first electrode connected to a driving gate electrode of the driving TFT; and a second electrode provided on the first electrode and insulated from the first electrode.

7. The TFT array substrate of claim 6, further comprising an interlayer insulating film disposed over the storage capacitor and comprising an opening, wherein the second electrode is disposed in the opening.

8. The TFT array substrate of claim 1, wherein the switching source region surrounding the source contact portion includes a first switching source region close to the switching channel region and a second switching source region far away from the switching channel region, and the first and second switching source regions comprises impurities of the same type, and wherein the switching drain region surrounding the drain contact portion includes a first switching drain region close to the switching channel region and a second switching drain region far away from the switching channel region, and the first and second switching drain regions comprises impurities of the same type.

9. The TFT array substrate of claim 1, wherein the switching source region comprises impurities of the same type in the vertical direction with respect to the substrate, and wherein the switching drain region comprises impurities of the same type in the vertical direction with respect to the substrate.

10. An organic light-emitting display apparatus comprising:
a display area comprising a plurality of pixels; and
a non-display area disposed around the display area,
wherein each of the plurality of pixels comprises:
a gate insulating film provided on a substrate;
a driving thin-film transistor (TFT) provided on the substrate; and
a switching TFT provided on the substrate and comprising:
a switching semiconductor layer comprising a switching channel region, a switching source region, and a switching drain region; and
a switching source electrode and a switching drain electrode contacting the switching semiconductor layer,
wherein the switching source electrode comprises a source contact portion surrounded by the switching source region on at least two opposite sides of the source contact portion and contacting the switching source region in a vertical direction with respect to the substrate,
wherein the switching drain electrode comprises a drain contact portion surrounded by the switching drain region on at least two opposite sides of the drain contact portion and contacting the switching drain region in the vertical direction with respect to the substrate,
wherein the source contact portion comprises one selected from p-type impurities and n-type impurities, the switching source region comprising the other one of the p-type and n-type impurities not selected by the source contact portion,
wherein the drain contact portion comprises one selected from p-type impurities and n-type impurities, the switching drain region comprising the other one of the p-type and n-type impurities not selected by the drain contact portion, and
wherein the source contact portion, the drain contact portion, an upper surface of the switching source region and an upper surface of the switching drain region each directly contact the gate insulating film.

11. The organic light-emitting display apparatus of claim 10, wherein the switching source region and the switching drain region are p-type doped, and the source contact portion and the drain contact portion are n-type doped.

12. The organic light-emitting display apparatus of claim 10, wherein the switching source region and the switching drain region are n-type doped, and the source contact portion and the drain contact portion are p-type doped.

13. The organic light-emitting display apparatus of claim 10, further comprising a storage capacitor comprising: a first electrode connected to a driving gate electrode of the driving TFT; and a second electrode provided on the first electrode and insulated from the first electrode.

14. The organic light-emitting display apparatus of claim 13, wherein the driving TFT and the storage capacitor are arranged so that at least parts of the driving TFT and the storage capacitor overlap each other.

15. A thin-film transistor (TFT) array substrate comprising:
a gate insulating film provided on a substrate;
a driving TFT provided on the substrate; and
a switching TFT provided on the substrate and comprising:
a switching semiconductor layer comprising a switching channel region, a switching source region, and a switching drain region; and
a switching source electrode and a switching drain electrode contacting the switching semiconductor layer,
wherein the switching source electrode comprises a source contact portion surrounded by the switching source region and contacting the switching source region in a vertical direction with respect to the substrate,
wherein the switching drain electrode comprises a drain contact portion surrounded by the switching drain region and contacting the switching drain region in the vertical direction with respect to the substrate,
wherein the source contact portion comprises only one selected from p-type impurities and n-type impurities, the switching source region comprising only the other one of the p-type and n-type impurities not selected by the source contact portion,
wherein the drain contact portion comprises only one selected from p-type impurities and n-type impurities, the switching drain region comprising only the other one of the p-type and n-type impurities not selected by the drain contact portion, and
wherein the source contact portion, the drain contact portion, an upper surface of the switching source region and an upper surface of the switching drain region each directly contact the gate insulating film.

* * * * *